(12) United States Patent
Tsuda et al.

(10) Patent No.: US 8,004,160 B2
(45) Date of Patent: Aug. 23, 2011

(54) ACOUSTIC WAVE DEVICE WITH ADHESIVE LAYER AND METHOD OF MANUFACTURING THE SAME

(75) Inventors: Keiji Tsuda, Yokohama (JP); Jyouji Kimura, Yokohama (JP); Shunichi Aikawa, Yokohama (JP)

(73) Assignee: Taiyo Yuden Co., Ltd, Tokyo (JP)

( * ) Notice: Subject to any disclaimer, the term of this patent is extended or adjusted under 35 U.S.C. 154(b) by 308 days.

(21) Appl. No.: 12/341,279

(22) Filed: Dec. 22, 2008

(65) Prior Publication Data

US 2009/0160290 A1 Jun. 25, 2009

(30) Foreign Application Priority Data

Dec. 25, 2007 (JP) ................. 2007-333138

(51) Int. Cl.
*H01L 41/04* (2006.01)
*H01L 41/08* (2006.01)
(52) U.S. Cl. .................... 310/348; 310/313 R
(58) Field of Classification Search ............. 310/348, 310/344, 313 R
See application file for complete search history.

(56) References Cited

U.S. PATENT DOCUMENTS

| | | | | |
|---|---|---|---|---|
| 4,736,128 A * | 4/1988 | Takoshima et al. | ....... | 310/313 R |
| 6,552,475 B2 * | 4/2003 | Hori et al. | ..... | 310/364 |
| 6,710,682 B2 * | 3/2004 | Onishi et al. | ..... | 333/193 |
| 6,815,830 B2 * | 11/2004 | Miyasaka | ..... | 257/778 |
| 6,815,869 B2 * | 11/2004 | Baba et al. | ..... | 310/313 R |
| 6,852,561 B2 * | 2/2005 | Bidard et al. | ..... | 438/50 |
| 6,914,367 B2 * | 7/2005 | Furukawa | ..... | 310/340 |
| 7,112,913 B2 * | 9/2006 | Shimoe et al. | ..... | 310/313 R |
| 7,154,206 B2 * | 12/2006 | Shimada et al. | ..... | 310/313 R |
| 7,230,512 B1 * | 6/2007 | Carpenter et al. | ..... | 333/193 |
| 7,459,829 B2 * | 12/2008 | Aoki et al. | ..... | 310/313 B |
| 7,583,161 B2 * | 9/2009 | Tanaka | ..... | 333/133 |
| 7,629,729 B2 * | 12/2009 | Inoue et al. | ..... | 310/348 |
| 2009/0001849 A1 * | 1/2009 | Tsuda | ..... | 310/313 R |
| 2010/0045145 A1 * | 2/2010 | Tsuda | ..... | 310/365 |
| 2011/0043078 A1 * | 2/2011 | Tsuda | ..... | 310/364 |

FOREIGN PATENT DOCUMENTS

| | | |
|---|---|---|
| JP | 2002-217673 A | 8/2002 |
| JP | 2003-338729 A | 11/2003 |
| JP | 2004-180177 A | 6/2004 |
| JP | 2005-286917 A | 10/2005 |
| JP | 2006-352430 A | 12/2006 |

* cited by examiner

*Primary Examiner* — J. SanMartin
(74) *Attorney, Agent, or Firm* — Arent Fox LLP

(57) ABSTRACT

An acoustic wave device includes a substrate, an acoustic wave element, an electrode pad, a resin portion and a metal post. The acoustic wave element is provided on the substrate. The electrode pad is provided on the substrate, is electrically coupled to the acoustic wave element, and has an Au layer and an adhesive layer formed on the Au layer and having an opening. The resin portion is provided on the substrate so as to cover the acoustic wave element and the electrode pad, and has a through-hole formed to expose a surface of the electrode pad. The metal post is provided in the through-hole and contacts with the Au layer through the opening of the adhesive layer. The adhesive layer is provided between the Au layer and the resin portion.

12 Claims, 7 Drawing Sheets

ACOUSTIC WAVE DEVICE WITH ADHESIVE LAYER AND METHOD OF MANUFACTURING THE SAME

CROSS-REFERENCE TO RELATED APPLICATION

This application is based upon and claims the benefit of priority of the prior Japanese Patent Application No. 2007-333138, filed on Dec. 25, 2007, the entire contents of which are incorporated herein by reference.

FIELD

The present invention generally relates to an acoustic wave device and a method of manufacturing the acoustic wave device, and more particularly, to an acoustic wave device having resin portion and a method of manufacturing the acoustic wave device.

BACKGROUND

There is used a surface acoustic wave device as an acoustic wave device that has an IDT (Interdigital Transducer) formed with a comb electrode on a surface of a piezoelectric substrate and uses an acoustic wave excited with an implied electrical power to the comb electrode. The acoustic wave device such as the surface acoustic wave device is being widely used for a circuit treating a radio signal such as a band pass filter for transmission, a band pass filter for reception or an antenna duplexer.

There is developed a WLP (Wafer Level Package) technology for downsizing a package to a size of an acoustic wave element in order to downsize a surface acoustic wave device. An IDT 12 and an electrode pad 13 are formed on a wafer-shaped piezoelectric substrate 10, with reference to FIG. 1 of Japanese Patent Application Publication No. 2006-352430. A first insulating layer and a second insulating layer are formed on the piezoelectric substrate 10 so as to have a through-hole on the electrode pad 13. It is therefore possible to electrically couple an upper face of the insulating layer and the IDT 12 via the through-hole.

There is, however, a problem that adhesiveness is not high between a resin portion acting as the first insulating layer and the electrode pad.

SUMMARY

The present invention has been made in view of the above circumstances and provides an acoustic wave device in which adhesiveness between a resin portion and an electrode is improved, and a method of manufacturing the acoustic wave device.

According to an aspect of the present invention, there is provided an acoustic wave device including a substrate, an acoustic wave element, and electrode pad, a resin portion and a metal post. The acoustic wave element is provided on the substrate. The electrode pad is provided on the substrate, is electrically coupled to the acoustic wave element, and has an Au layer and an adhesive layer formed on the Au layer and having an opening. The resin portion is provided on the substrate so as to cover the acoustic wave element and the electrode pad, and has a through-hole formed to expose a surface of the electrode pad. The metal post is provided in the through-hole and contacts with the Au layer through the opening of the adhesive layer. The adhesive layer is provided between the Au layer and the resin portion. With the structure, contact resistance may be reduced between the metal post and the electrode pad, because the metal post contacts with the Au layer. And resistance may be reduced between the metal post and the acoustic wave element, because the electrode pad includes the Au layer. Adhesiveness between the Au layer and the resin portion may be improved, because the adhesive layer is provided between the Au layer and the resin portion.

According to an aspect of the present invention, there is provided a method of manufacturing an acoustic wave device including forming an electrode pad that is provided on a substrate, is electrically coupled to an acoustic wave element on the substrate, and has an Au layer and an adhesive layer formed on the Au layer and having an opening, forming a resin portion that is provided on the substrate so as to cover the acoustic wave element and the electrode pad, and has a through-hole formed so as to expose a surface of the electrode pad, and forming a metal post that is provided in the through-hole and contacts with the Au layer through the opening of the adhesive layer. The resin portion is formed so that the adhesive layer is formed between the Au layer and the resin portion. With the method, adhesiveness between the Au layer and the resin portion may be improved, because the adhesive layer is provided between the Au layer and the resin portion.

DESCRIPTION OF EMBODIMENTS

In order to facilitate better understanding of the present invention, a description will now be given of related art.

First Embodiment

Figure 1A:
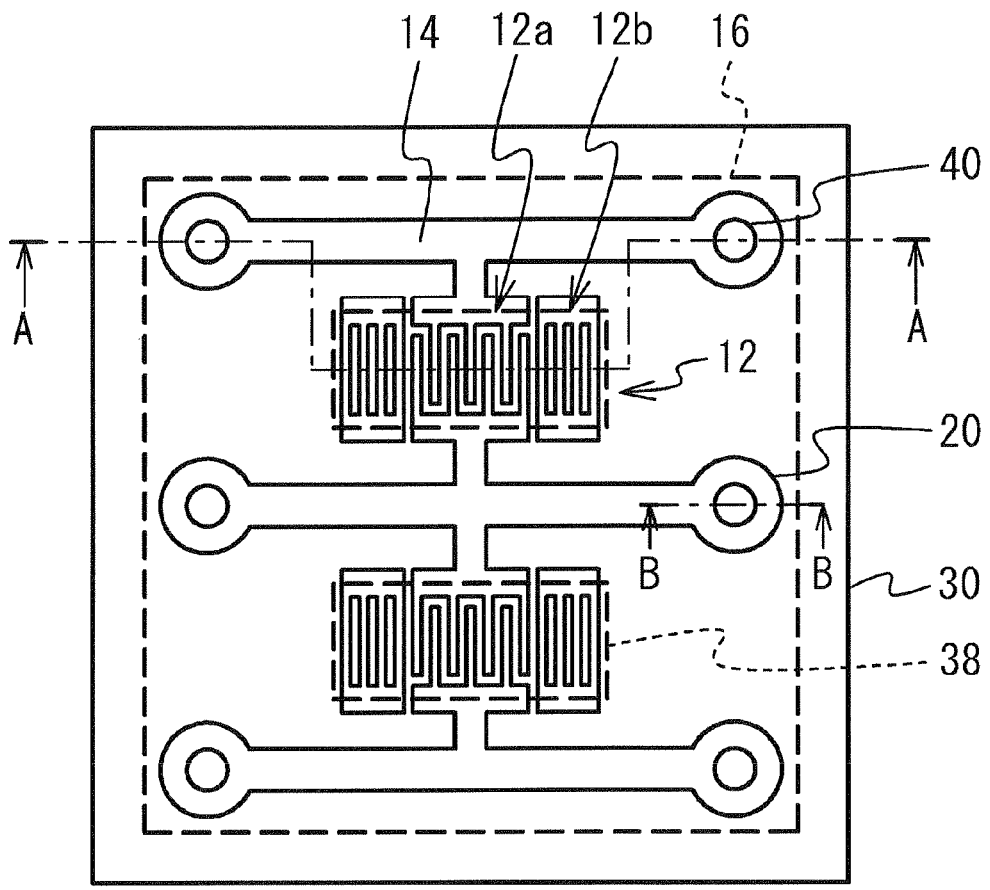
FIG. 1A illustrates a top view of an acoustic wave device in accordance with a first embodiment.
Figure 1B:
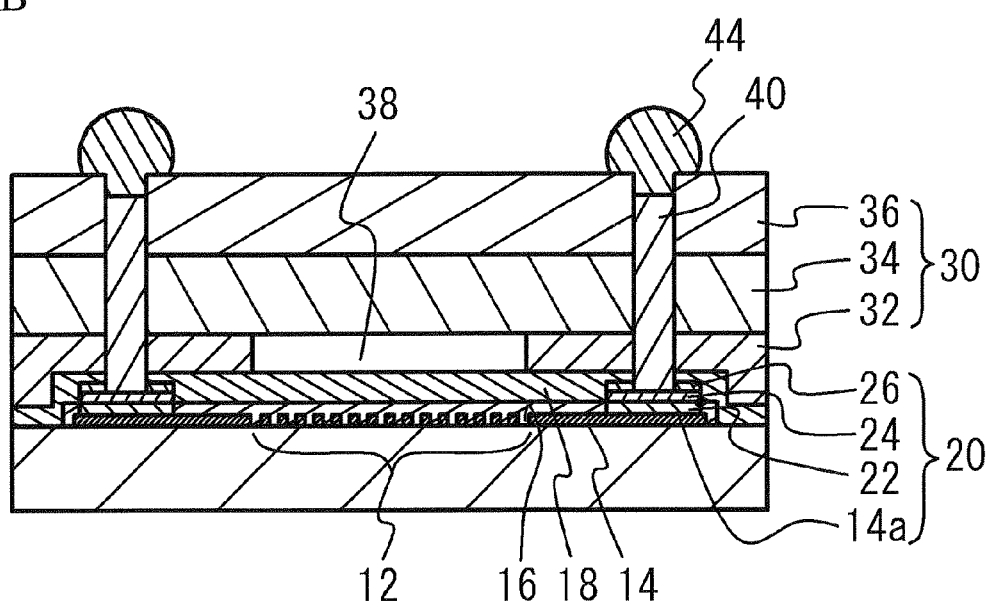
FIG. 1B illustrates a cross sectional view taken along with a line A-A of FIG. 1A.

FIG. 1A illustrates a top view of an acoustic wave device in accordance with a first embodiment. FIG. 1B illustrates a cross sectional view taken along a line A-A of FIG. 1A. As illustrated in FIG. 1A and FIG. 1B, there is formed an acoustic wave element 12 such as a comb electrode 12a and a reflector 12b on a piezoelectric substrate 10 such as a $LiNbO_3$ substrate or a $LiTaO_3$ substrate, the comb electrode being made of metal layer of Al including 1% copper. There is formed an interconnection 14 made of the same metal layer as the acoustic wave element 12. There is formed an electrode pad 20 electrically coupled to the acoustic wave element 12 via the interconnection 14, on the piezoelectric substrate 10. The electrode pad 20 has a four-layer structure in which a bottom layer 14a, an adhesive layer 22, an Au layer 24 and an adhesive layer 26 are laminated in order from bottom, the bottom layer 14a being made of the same metal layer as the interconnection 14, the adhesive layer 22 being made of a metal such as Ti having high adhesiveness, the adhesive layer 26 being made of a metal such as Ti having high adhesiveness.

There are formed a protective layer 16 and a protective layer 18 made of Si compound layer such as a silicon oxide layer or a silicon nitride layer, on the acoustic wave element 12 and the interconnection 14. The protective layer 16 and the protective layer 18 act as a protective layer and adjust frequency of the acoustic wave element 12. That is, the acoustic wave element 12 is designed so as to resonate at a desirable frequency because of total thickness of the protective layer 16 and the protective layer 18.

There is formed a resin portion 30 on the piezoelectric substrate 10 so as to cover the acoustic wave element 12 and the electrode pad 20, the resin portion 30 being made of a first resin layer 32, a second resin layer 34 and a third resin layer 36. There is formed a cavity 38 on an excitation region of the resin portion 30 (the IDT and the reflector) where an acoustic wave of the acoustic wave element 12 is excited. Here, a through-hole is formed in the resin portion 30 so as to expose the electrode pad 20. A metal post 40 is formed in the through-hole. There is formed a solder ball such as SnAgCu on the metal post 40. An opening is formed in the adhesive layer 26. The metal post 40 contacts with the Au layer 24 in the electrode pad 20 through the opening of the adhesive layer 26.

Figure 2A:
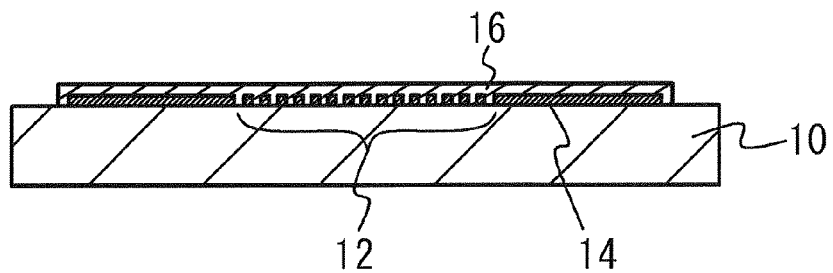
FIG. 2A through FIG. 2D illustrate a manufacturing process of the acoustic wave device in accordance with the first embodiment.
Figure 2B:
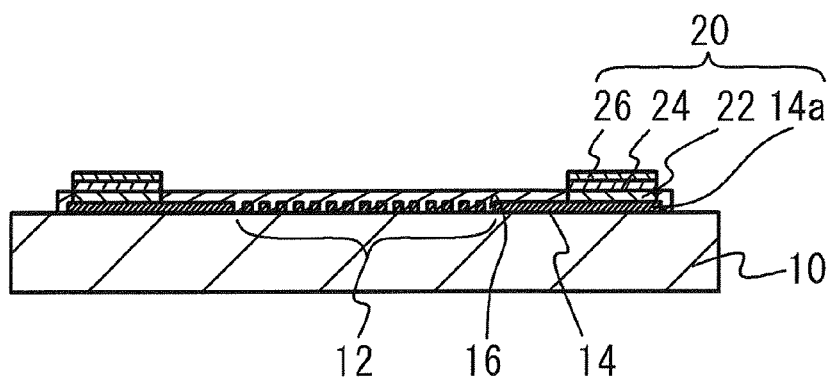

A description will be given of a method of manufacturing the acoustic wave device in accordance with the first embodiment, with reference to FIG. 2A through FIG. 3D. As illustrated in FIG. 2A, the acoustic wave element 12 and the interconnection 14 are formed on the piezoelectric substrate 10 with an evaporation method and a lift-off method. The protective layer 16 is formed so as to cover the acoustic wave element 12 and the interconnection 14 with a sputtering method or the like. As illustrated in FIG. 2B, a region of the protective layer 16 where the electrode pad 20 is to be formed is removed with a dry etching method. The adhesive layer 22, the Au layer 24 and the adhesive layer 26 are formed on the region of the protective layer 16 with the evaporation method and the lift-off method. Thus, the electrode pad 20 structured with the bottom layer 14a, the adhesive layer 22, the Au layer 24 and the adhesive layer 26 is formed.

Figure 2C:
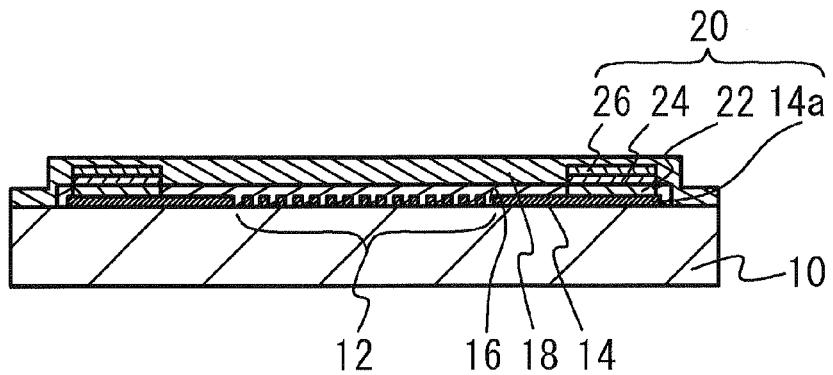
Figure 2D:
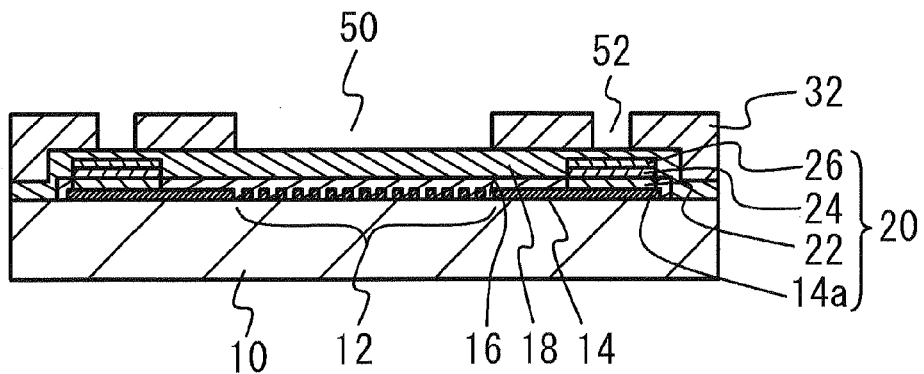

As illustrated in FIG. 2C, the protective layer 18 is formed on the protective layer 16 and the electrode pad 20 with the sputtering method or the like. As illustrated in FIG. 2D, epoxy-based photosensitive negative resist having thickness of approximately 30 μm is coated on the piezoelectric substrate 10. The first resin layer 32 is formed so that a through-hole 52 is formed on the electrode pad 20 and an opening 50 is formed on the excitation region of the acoustic wave element 12, with an exposure method.

Figure 3A:
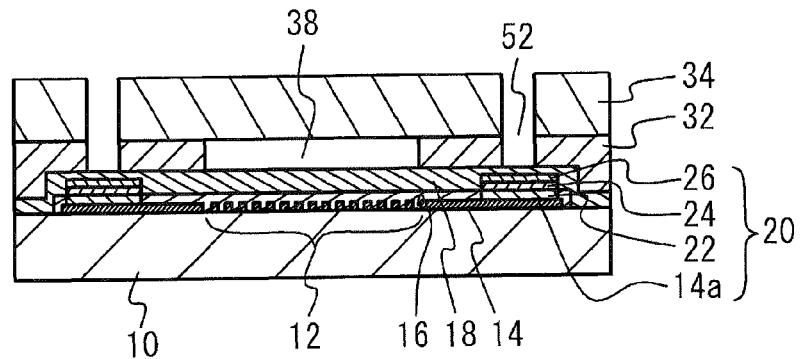
FIG. 3A through FIG. 3D illustrate the manufacturing process of the acoustic wave device in accordance with the first embodiment.
Figure 3B:
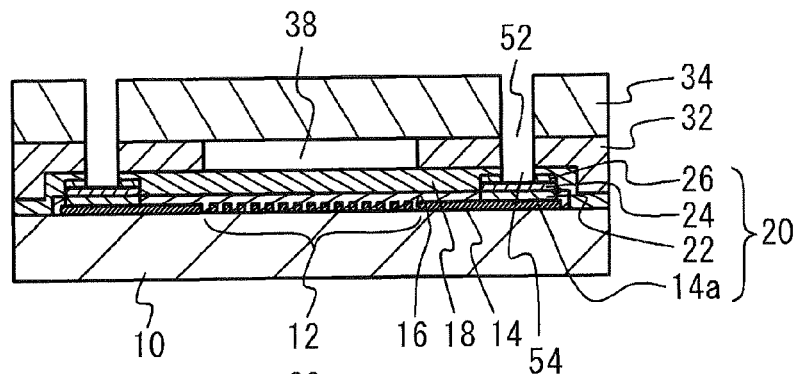

As illustrated in FIG. 3A, an epoxy-based photosensitive negative resist having thickness of approximately 30 μm is formed on the first resin layer 32 with tenting method. The second resin layer 34 is formed with the exposure method so that the through-hole 52 of the second resin layer 34 communicates with the through-hole of the first resin layer 32. Thus, the opening 50 of the first resin layer 32 forms the cavity 38 on the excitation region. As illustrated in FIG. 3B, the protective layer 18 and the adhesive layer 26 under the through-hole 52 are dry-etched with use of the second resin layer 34 as a mask. Thus, an opening 54 is formed in the protective layer 18 and the adhesive layer 26. And, the surface of the Au layer 24 is exposed.

Figure 3C:
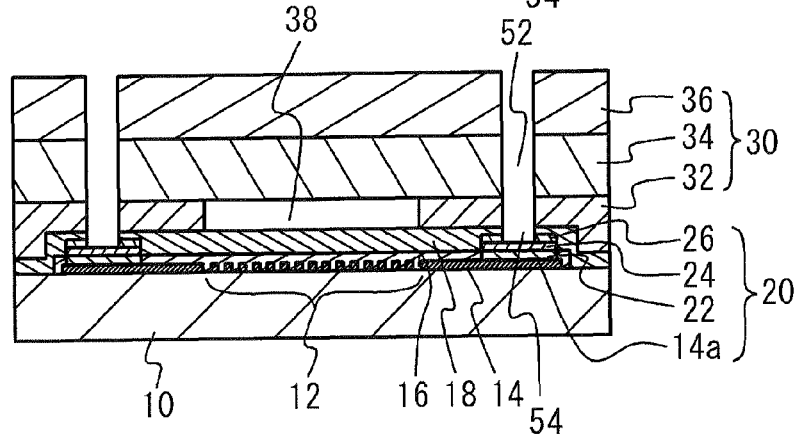
Figure 3D:
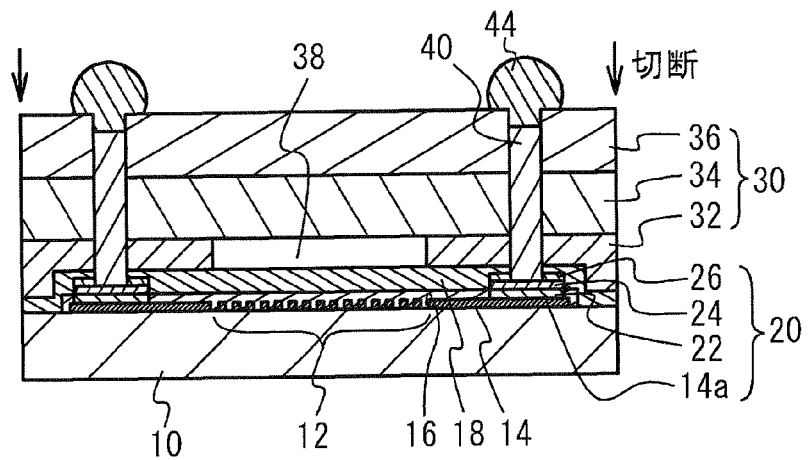

As illustrated in FIG. 3C, an epoxy-based photosensitive negative resist having thickness of approximately 30 μm is formed on the second resin layer 34 with the tenting method. The third resin layer 36 is formed with the exposure method so that the through-hole of the first resin layer 32 and the second resin layer 34 communicates with the through-hole 52 of the third resin layer 36. As illustrated in FIG. 3D, the metal post 40 made of a metal such as Au is formed in the through-hole 52 with a plating method. A SnAgCu solder paste is formed on the metal post 40 with a printing method. A solder 44 is formed with a re-flow. The resin portion 30 and the piezoelectric substrate 10 are cut off with a dicing method. With the above-mentioned processes, the acoustic wave device in accordance with the first embodiment is manufactured.

Figure 4:
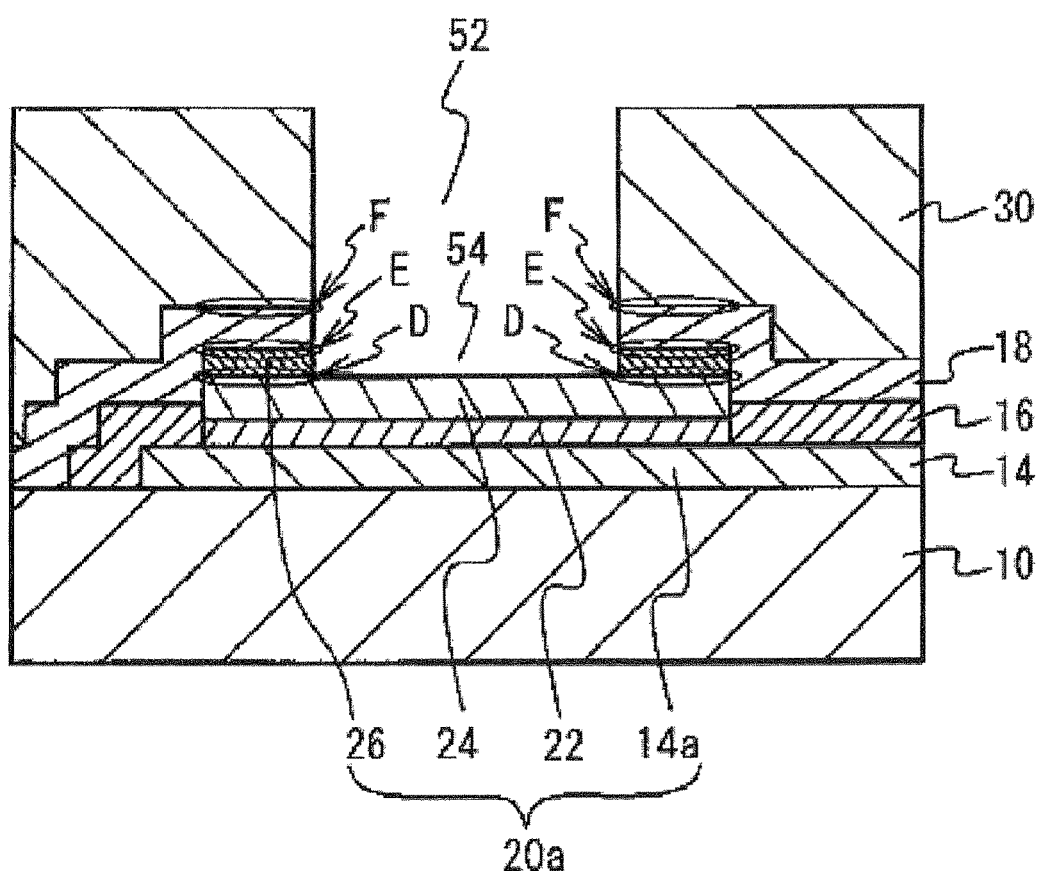
FIG. 4 illustrates an enlarged view around an electrode pad of the first embodiment.

FIG. 4 illustrates an enlarged view of FIG. 3C illustrating the method of the acoustic wave device in accordance with the first embodiment, corresponding to the cross sectional view taken along a line B-B of FIG. 1A. As illustrated in FIG. 4, the Au layer 24 is exposed through the through-hole 52 formed in the resin portion 30 and the opening 54 formed in the protective layer 18 and the adhesive layer 26, at a center area of the electrode pad 20. Around the electrode pad 20, the adhesive layer 26 is formed on the Au layer 24, the protective layer 18 is formed on the adhesive layer 26, and the resin portion 30 is formed on the protective layer 18.

Figure 5A:
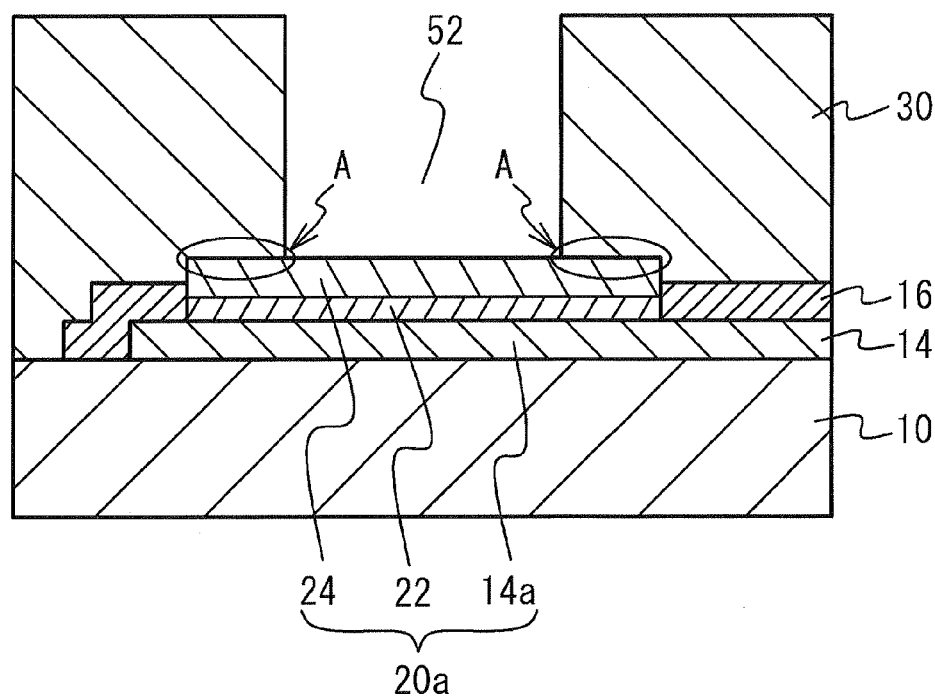
FIG. 5A and FIG. 5B illustrate a cross sectional view of acoustic wave devices in accordance with a first comparative embodiment and a second comparative embodiment.
Figure 5B:
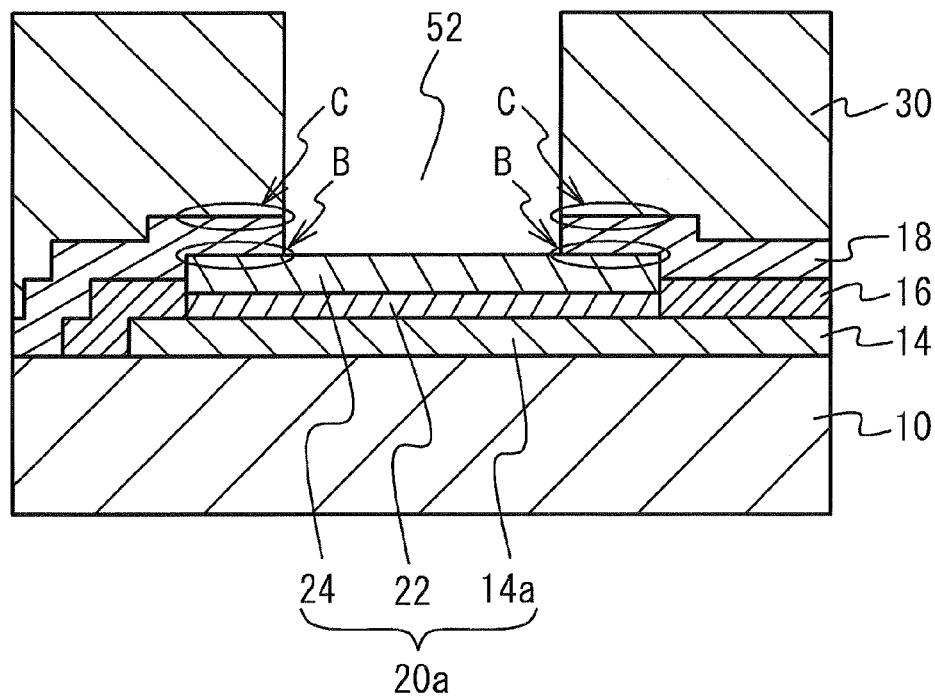

FIG. 5A and FIG. 5B respectively illustrate a cross sectional view of a first comparative embodiment and a second comparative embodiment. As illustrated in FIG. 5A, the resin portion 30 is formed directly on the Au layer 24 around the electrode pad 20 in the first comparative embodiment. As illustrated in FIG. 5B, the protective layer 18 is formed directly on the Au layer 24 around the electrode pad 20, and the resin portion 30 is formed on the protective layer 18, in the second comparative embodiment.

As illustrated in FIG. 4 through FIG. 5B, the Au layer 24 is exposed in the first embodiment, the first comparative embodiment and the second comparative embodiment. The metal post 40 is therefore formed so as to contact with the Au layer 24 in FIG. 3D. It is possible to form the metal post on the electrode pad 20 stably when the metal post 40 is formed and it is possible to reduce contact resistance between the metal post 40 and the electrode pad 20, because the surface of the Au layer 24 has resistance to oxidation. It is possible to reduce the resistance between the interconnection 14 and the metal post 40, because the Au layer 24 is used.

However, the resin portion 30 directly contacts with the Au layer 24 around the electrode pad 20 in the first comparative embodiment, as illustrated in FIG. 5A. Adhesiveness at an interface A between the Au layer 24 and the resin portion 30 is not high. The resin portion 30 therefore tends to be peeled. And, a plating solution intrudes between the Au layer 24 and the resin portion 30, when the metal post 40 is formed.

In the second comparative embodiment, the protective layer 18 directly contacts with the Au layer 24 around the electrode pad 20 as illustrated in FIG. 5B. The resin portion 30 is formed directly on the protective layer 18. In the second comparative embodiment, the resin portion 30 directly contacts with the protective layer 18. Adhesiveness is high between the protective layer 18 made of Si compound and the resin portion 30 made of organic layer such as epoxy resin. It is therefore possible to improve adhesiveness at an interface C between the protective layer 18 and the resin portion 30. Adhesiveness is, however, not high at an interface B between the Au layer 24 and the protective layer 18. The plating solution intrudes into the interface B between the Au layer 24 and the protective layer 18.

As illustrated in FIG. 4, the adhesive layer 26 is formed between the Au layer 24 and the resin portion 30 and contacts with the Au layer 24, in the first embodiment. Adhesiveness is high between a metal such as Ti and the Au layer 24. It is therefore possible to improve the adhesiveness at an interface D between the adhesive layer 26 and the Au layer 24. It is therefore possible to improve the adhesiveness between the upper face of the Au layer 24 and the resin portion 30. And it is possible to restrain the intrusion of the plating solution into the upper face of the Au layer 24 when the metal post 40 is formed. It is preferable that the adhesive layer 26 is made of Ti in order to improve the adhesiveness between the Au layer 24 and the adhesive layer 26.

The protective layer 18 made of Si compound is formed between the adhesive layer 26 and the resin portion 30, and contacts with the adhesive layer 26 and the resin portion 30. Adhesiveness is high at an interface E between a metal such as Ti and the protective layer 18 made of Si compound layer such as silicon oxide layer or a silicon nitride layer. And adhesiveness is high at an interface F between the protective layer 18 and the resin portion 30. It is therefore possible to restrain a peeling of each layer. It is preferable that the protective layer 18 is made of a silicon oxide layer or a silicon nitride layer in order to improve the adhesiveness between the resin portion 30 and the protective layer 18 or between the resin portion 30 and the protective layer 18.

The protective layer 16 is a layer that protects the acoustic wave element 12 when the adhesive layer 22, the Au layer 24 and the adhesive layer 26 are formed, in FIG. 2B. The adhesiveness between the first resin layer 32 and the protective layer 16 is degraded when the first resin layer 32 is formed without formation of the protective layer 18 in FIG. 2D. A resist to be the first resin layer 32 is left on the protective layer 16 when the opening 50 and the through-hole 52 are formed. This is because the surface of the protective layer 16 is damaged because of an ashing after the lift-off process when the adhesive layer 22, the Au layer 24 and the adhesive layer 26 are formed. In the first embodiment, the surface of the protective layer 18 is not damaged because the protective layer 18 is formed on the protective layer 16. It is therefore possible to improve the adhesiveness between the first resin layer 32 and the protective layer 16 and to restrain remaining of the resist.

As illustrated in FIG. 3B, the opening 54 of the adhesive layer 26 is formed with the through-hole 52. This results in a boundary of the opening 54 of the adhesive layer 26 with the through-hole 52 of the resin portion 30. This results in contact between the metal post 40 in the through-hole 52 and the Au layer 24 in FIG. 3D. And it is possible to form the adhesive layer 26 between the Au layer 24 and the resin portion 30 in surrounding area of the electrode pad 20 other than the through-hole 52. It is therefore possible to improve the adhesiveness between the Au layer 24 and the resin portion 30.

It is preferable that the bottom layer 14a of the electrode pad 20 is made of the same material as the IDT of the acoustic wave element 12. This allows the formation of the IDT and the bottom layer 14a together as illustrated in FIG. 2A. And the manufacturing process may be simplified.

Second Embodiment

Figure 6:
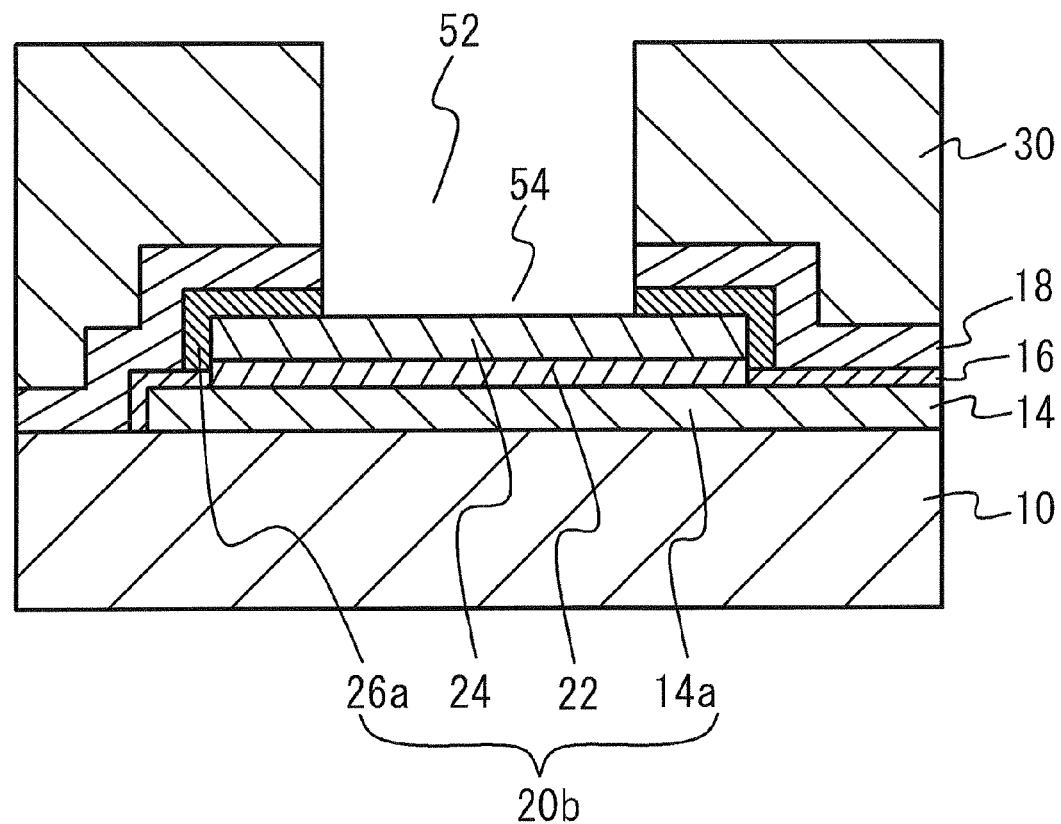
FIG. 6 illustrates a cross sectional view of an acoustic wave device in accordance with a second embodiment.

A second embodiment is an example where an adhesive layer covers a side face of an Au layer. FIG. 6 illustrates a cross sectional view of the acoustic wave device in accordance with the second embodiment corresponding to the cross sectional view taken along the line-B-B of FIG. 1A. As illustrated in FIG. 6, an adhesive layer 26a made of such as Ti covers a side face of the Au layer 24 completely. This results in restraint of a cell effect between the Au layer 24 and a metal layer (for example Al) forming the interconnection 14 and the acoustic wave element 12.

Third Embodiment

Figure 7:
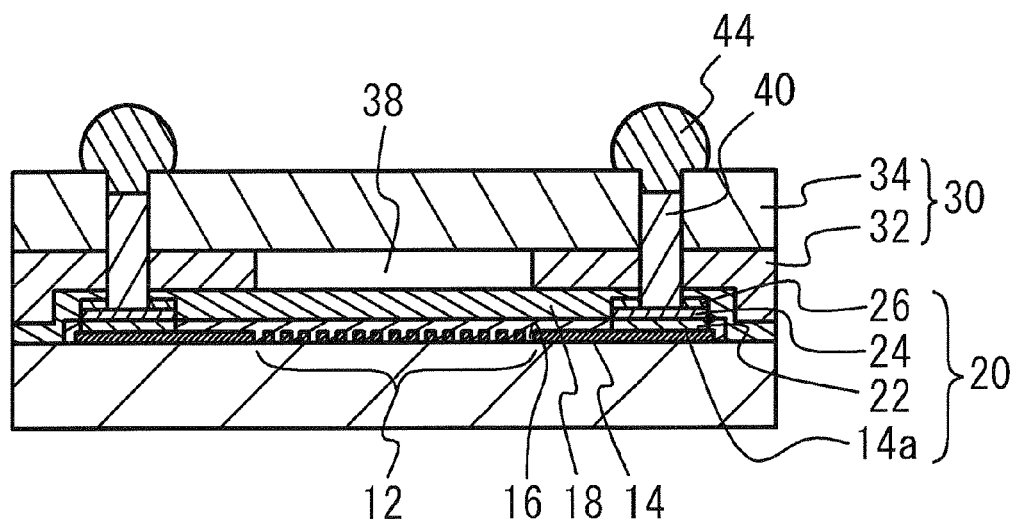
FIG. 7 illustrates a cross sectional view of an acoustic wave device in accordance with a third embodiment.

A third embodiment is an example in which the resin portion 30 is made of the first resin layer 32 and the second resin layer 34. FIG. 7 illustrates a cross sectional view of an acoustic wave element in accordance with the third embodiment. As illustrated in FIG. 7, the third resin layer 36 is not formed, being different from FIG. 1B of the first embodiment. The resin portion 30 may be made of two resin layers.

It is preferable that the resin portion 30 has the cavity 38 on the excitation region of the acoustic wave element 12, as in the case of the first embodiment through the third embodiment. The excitation region is a region where an acoustic wave is excited. In a surface acoustic wave element, the excitation region is an IDT and a reflector. In a FBAR (Film Bulk Acoustic Resonator), the excitation region is a sympathetic resonance region in which an upper electrode and a lower electrode hold a piezoelectric thin layer therebetween. Acoustic wave is not excited if the excitation region is covered with the resin portion 30. It is therefore preferable that the cavity 38 is formed on the excitation region. A piezoelectric substrate is not used but a silicon substrate, a glass substrate, a sapphire substrate or the like is used, and a piezoelectric thin layer is formed on the substrate, in a case where the FBAR is used as an acoustic wave element.

It is preferable that the first resin layer 32 has the opening 50 for forming the cavity 38 on the excitation region of the acoustic wave element 12 as illustrated in FIG. 2D, and the second resin layer 34 is formed so as to cover the cavity 38 as illustrated in FIG. 3A, when the resin portion 30 is formed. In this case, the cavity 38 is easily formed on the excitation region.

The cavity 38 on the excitation region is not necessary if the acoustic wave element is a surface acoustic boundary wave element. In this case, the resin portion 30 may be made of a single resin layer.

The present invention is not limited to the specifically disclosed embodiments, but variations and modifications may be made without departing from the scope of the present invention.

The invention claimed is:
1. An acoustic wave device comprising:
a substrate;
an acoustic wave element provided on the substrate;
an electrode pad that is provided on the substrate, is electrically coupled to the acoustic wave element, and has an Au layer and an adhesive layer formed on the Au layer and having an opening;
a resin portion that is provided on the substrate so as to cover the acoustic wave element and the electrode pad, wherein the resin portion has a through-hole formed so as to expose a surface of the electrode pad;
a metal post that is provided in the through-hole and contacts with the Au layer through the opening of the adhesive layer; and
a Si compound layer that is provided between the adhesive layer and the resin portion and contacts with the adhesive layer and the resin portion,
wherein the adhesive layer is provided between the Au layer and the resin portion, and
wherein the adhesive layer is made of a material that provides for a degree of adhesion between the adhesive layer and the Si compound layer that is higher than the degree of adhesion between Au and the Si compound layer.

2. The acoustic wave device as claimed in claim 1, wherein the adhesive layer is provided on top of and in contact with the Au layer.

3. The acoustic wave device as claimed in claim 1, wherein the opening of the adhesive layer is defined with the through-hole of the resin portion.

4. The acoustic wave device as claimed in claim 1, wherein the adhesive layer covers a side face of the Au layer.

5. The acoustic wave device as claimed in claim 1, wherein a bottom layer of the electrode pad is made of the same material as an IDT of the acoustic wave element.

6. The acoustic wave device as claimed in claim 1, wherein the adhesive layer is a Ti layer.

7. The acoustic wave device as claimed in claim 1, wherein the Si compound layer is a silicon oxide layer or a silicon nitride layer.

8. The acoustic wave device as claimed in claim 1, wherein the resin portion has a cavity on an excitation region of the acoustic wave element.

9. The acoustic wave device as claimed in claim 1, wherein the resin portion has a first resin layer and a second resin layer, the first resin layer having an opening for forming a cavity on an excitation region of the acoustic wave element, the second resin layer covering the cavity.

10. The acoustic wave device as claimed in claim 1, wherein the adhesive layer is made of Ti.

11. A method of manufacturing an acoustic wave device comprising:
    forming an electrode pad that is provided on a substrate, is electrically coupled to an acoustic wave element on the substrate, and has an Au layer and an adhesive layer formed on the Au layer and having an opening;
    forming a Si compound layer on to of and in contact with the adhesive layer;
    forming a resin portion that is provided on the substrate so as to cover the acoustic wave element and the electrode pad, wherein the resin portion has a through-hole formed so as to expose a surface of the electrode pad; and
    forming a metal post that is provided in the through-hole and contacts with the Au layer through the opening of the adhesive layer,
    wherein the resin portion is formed so that the adhesive layer is formed between the Au layer and the resin portion, and
    wherein the adhesive layer is made of a material that provides for a degree of adhesion between the adhesive layer and the Si compound layer that is higher than the degree of adhesion between Au and the Si compound layer.

12. The method as claimed in claim 11, wherein the opening of the adhesive layer is formed with use of the through-hole.

* * * * *